US009134538B1

(12) United States Patent
Augst et al.

(10) Patent No.: US 9,134,538 B1
(45) Date of Patent: Sep. 15, 2015

(54) METHODS, SYSTEMS, AND APPARATUS FOR COHERENT BEAM COMBINING

(71) Applicants: Steven J. Augst, Acton, MA (US); Juan Camilo Montoya, Belmont, MA (US); Tso Yee Fan, Belmont, MA (US); Antonio Sanchez-Rubio, Lexington, MA (US)

(72) Inventors: Steven J. Augst, Acton, MA (US); Juan Camilo Montoya, Belmont, MA (US); Tso Yee Fan, Belmont, MA (US); Antonio Sanchez-Rubio, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 23 days.

(21) Appl. No.: 13/760,186

(22) Filed: Feb. 6, 2013

(51) Int. Cl.
| H01S 3/082 | (2006.01) |
| H01S 3/10 | (2006.01) |
| H01S 3/13 | (2006.01) |
| H01S 5/00 | (2006.01) |
| G02B 27/10 | (2006.01) |
| H01S 5/10 | (2006.01) |
| H01S 3/08 | (2006.01) |
| H01S 5/14 | (2006.01) |

(52) U.S. Cl.
CPC ............ *G02B 27/106* (2013.01); *H01S 5/1007* (2013.01); *H01S 5/1021* (2013.01); *H01S 3/08009* (2013.01); *H01S 3/0826* (2013.01); *H01S 5/148* (2013.01)

(58) Field of Classification Search
CPC ............ H01S 3/08004; H01S 3/08009; H01S 3/082–3/0826; H01S 5/1007; H01S 5/1021; H01S 5/148
See application file for complete search history.

(56) References Cited

U.S. PATENT DOCUMENTS

| 3,970,963 | A | * | 7/1976 | Chester | 372/102 |
| 4,649,351 | A | * | 3/1987 | Veldkamp et al. | 372/18 |
| 5,027,359 | A | * | 6/1991 | Leger et al. | 372/18 |
| 5,333,219 | A | * | 7/1994 | Kuznetsov | 372/50.11 |
| 5,661,747 | A | * | 8/1997 | Hiiro | 372/101 |
| 6,157,755 | A | * | 12/2000 | Brauch et al. | 372/50.22 |

(Continued)

FOREIGN PATENT DOCUMENTS

WO    WO2004/068652 A2    8/2004

OTHER PUBLICATIONS

D. R. Scifres, R. D. Burnham, and W. Streifer, "Phaselocked semiconductor laser array," Appl. Phys. Lett. 33, 1015 (1978); doi: 10.1063/1.90253.

(Continued)

*Primary Examiner* — Julio J Maldonado
*Assistant Examiner* — Sean Hagan
(74) *Attorney, Agent, or Firm* — Cooley LLP

(57) ABSTRACT

Coherent beam combining of laser gain elements achieves high output power in a diffraction limited beam. An active beam combining system coherently combines optical beams emitted by semiconductor laser gain elements in an external resonant cavity configuration. A beam combiner in the resonant cavity combines the outputs of the laser gain elements into a single coherent output beam whose power is monitored by a photodetector. A processor uses the photodetector's output to adjust the phases of the respective optical beams emitted by the laser gain elements so as to increase or maximize the coherent output beam's power. The processor may vary the optical beams' phases according to a stochastic parallel gradient descent (SPGD) algorithm for active phase control. Experimental results show a beam combining efficiency of 81% with an upper limit of 90% or higher and without the scaling limits imposed on passive-phasing systems.

33 Claims, 9 Drawing Sheets

(56) References Cited

U.S. PATENT DOCUMENTS

| | | | |
|---|---|---|---|
| 6,697,192 | B1 | 2/2004 | Fan et al. |
| 7,440,174 | B2 | 10/2008 | Rice et al. |
| 7,729,398 | B2 * | 6/2010 | Livingston ............... 372/30 |
| 2002/0181035 | A1 * | 12/2002 | Donoghue ............... 359/10 |

OTHER PUBLICATIONS

Dmitrii Kouznetsov, Jean-Francois Bisson, Akira Shirakawa and Ken-ichi Ueda, "Limits of Coherent Addition of Lasers: Simple Estimate," Optical Review, vol. 12, No. 6 (2005) 445-447.

J. R. Leger, G. J. Swanson, W. Veldkamp, "Coherent laser addition using binary phase gratings," Appl. Opt., 26, 4391 (1987).

Juan Montoya, Steven J. Augst, Kevin Creedon, Jan Kansky, Tso Yee Fan, and Antonio Sanchez-Rubio, "External cavity beam combining of 21 semiconductor lasers using SPGD," Appl. Opt. 51, 1724-1728 (2012) http://www.opticsinfobase.org/ao/abstract.cfm?URI=ao-51/11/1724.

M. A. Vorontsov and V. P. Sivokon, "Stochastic parallel-gradient-descent technique for high-resolution wave-front phase-distortion correction," J. Opt. Soc. Am. A, vol. 15, No. 10, pp. 2745-2758 (Oct. 1998).

P. F. McManamon, "Review of ladar: a historic, yet emerging, sensor technology with rich phenomenology," Opt. Engineering, 51, 060901 (2012).

S. J. Augst, J. Montoya, K. Creedon, J. Kansky, T. Y. Fan, and A. Sanchez-Rubio, "Intracavity coherent beam combining of 21 semiconductor gain elements using SPGD," in CLEO: Science and Innovations, OSA Technical Digest (online) (Optical Society of America, 2012), paper CTu1D.1.

S. J. Augst, S. M. Redmond, C. X. Yu, D. J. Ripin, T. Y. Fan, G. D. Goodno, P. A. Thielen, J.E. Rothenberg and A. Sanchez, "Coherent and Spectral Beam Combining of Fiber Lasers," Proc. of SPIE, 8237, 823704, (2012).

S. M. Redmond, K. J. Creedon, J. E. Kansky, S. J. Augst, L. J. Missaggia, M. K. Connors, R. K. Huang, B. Chann, T. Y. Fan, G. W. Turner, and A. Sanchez-Rubio "Active Coherent beam combining of diode lasers," Opt. Lett., 36, 999 (2011).

Steve Sanders, Robert Waarts, Derek Nam, David Welch, Don Scifres et al., "High power coherent two dimensional semiconductor laser array," Appl. Phys. Lett. 64, 1478 (1994); doi: 10.1063/1.111992.

Steven J. Augst, T. Y. Fan, and Antonio Sanchez, "Coherent beam combining and phase noise measurements of ytterbium fiber amplifiers," Optics Letters, vol. 29, No. 5 (Mar. 1, 2004).

T. Tomie, "Tin laser-produced plasma as the light source for extreme ultraviolet lithography high-volume manufacturing: history, ideal plasma, present status, and prospects," J. Micro/Nanolith. MEMS MOEMS, 11, 021109 (2012).

T. Y. Fan, "Laser Beam Combining for High-Power, High-Radiance Sources," IEEE J. Sel. Top. Quant. Elect., 11, 567 (2005).

Augst, Steven J., et al., "Beam combining of ytterbium fiber amplifiers (Invited)", Optical Society of America, vol. 24, No. 8, Aug. 2007, pp. 1707-1715.

Augst, Steven J., et al., "Wavelength beam combining of ytterbium fiber lasers", Optics Letters, vol. 28, No. 5, Mar. 1, 2003, pp. 331-333.

Redmond, Shawn M. et al., "Diffractive coherent combining of a 2.5 kW fiber laser array into a 1.9 kW Gaussian beam", Optics Letters, vol. 37, No. 14, Jul. 15, 2012, pp. 2832-2834.

Yu, C. X. et al., "Coherent combining of a 4 kW, eight-element, fiber amplifier array", Optics Letters, vol. 36, No. 14, Jul. 15, 2011, pp. 2686-2688.

* cited by examiner

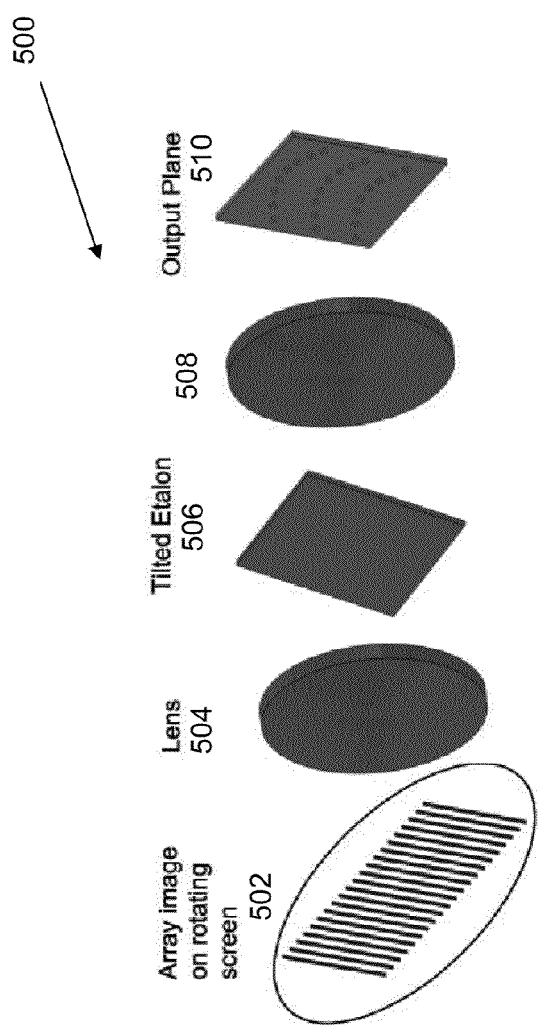
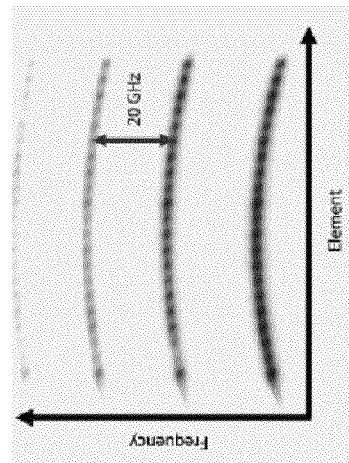
FIG. 5A
FIG. 5B

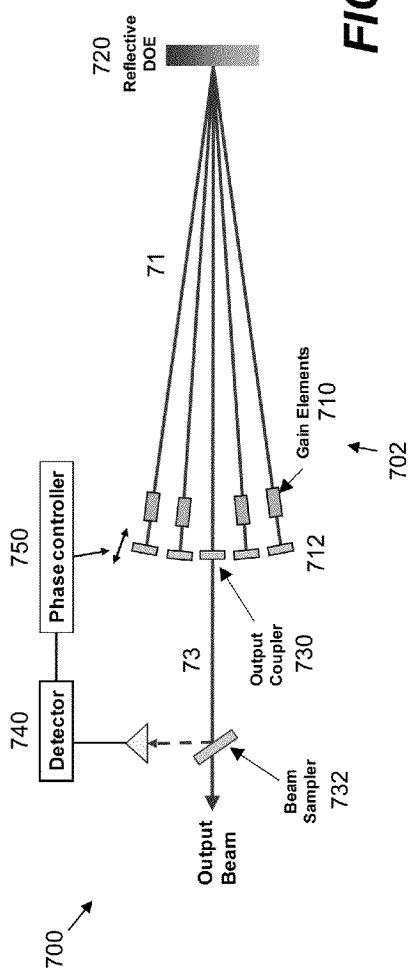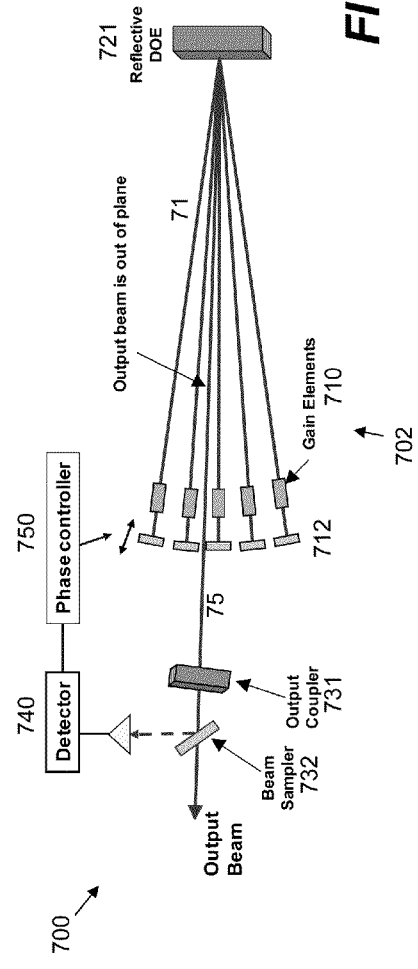

METHODS, SYSTEMS, AND APPARATUS FOR COHERENT BEAM COMBINING

GOVERNMENT SUPPORT

This invention was made with Government support under Contract No. FA8721-05-C-0002 awarded by the U.S. Air Force. The Government has certain rights in this invention.

BACKGROUND

Individual laser emitters are typically limited in output power due to thermal effects which degrade the laser efficiency, distort the wavefront, and limit the beam quality. Limits on individual emitter performance can be mitigated at least in part by coherently combining several of the outputs from many emitters to form a single high-power beam. This conventional technique, which is known as coherent beam combining (CBC), is an attractive way to achieve high output power in a single diffraction-limited beam.

There are two types of conventional CBC: (1) tiled aperture CBC and (2) filled aperture CBC. In a tiled aperture configuration, also known as a side-by-side configuration, mutually coherent beams from multiple emitters propagate parallel to each other to form a single beam with a small divergence angle and a large area. In practice, however, there are often gaps between adjacent beams-in the other words, this configuration suffers from a low fill factor. Unfortunately, these gaps yield undesired sidelobes in the far field.

In a filled aperture configuration, a grating or coupler combines beams from multiple emitters to form a single output beam. When combining N beams, the coupler acts as an N-port beamsplitter: if the input beams are mutually coherent, then constructive interference yields the coherent output beam at one port, and destructive interference yields little to no output power at the other ports. The degree of mutual coherence limits the amount of power that can be coupled into the coherent output beam.

The emitters in a filled aperture configuration may be mutually cohered using passive feedback from a resonant cavity. Each element emits light at a finite number of discrete longitudinal modes, and only some of these lines resonate within the cavity, which also supports a finite number of discrete modes. Ideally, the cavity and the emitters support only one common mode; the other emitter modes do not resonate within the cavity. As a result, the output power of the emitters is coherently coupled into the common mode to produce a high-power output beam. Because each of these transverse modes has a finite bandwidth and associated optical path length, however, the likelihood of supporting only one common mode goes down as the number of emitters goes up. This imposes a practical limit on the number of output beams that can be coherently combined using passive feedback in a resonant cavity. In some examples, the limit is only seven or eight output beams, which curtails the maximum possible power of the coherently combined beams. For more information on this limit, see Dmitrii Kouznetsov et al., "Limits of Coherent Addition of Lasers: Simple Estimate," Optical Review, Vol. 12, No. 6 (2005) 445-447, which is hereby incorporated herein by reference in its entirety.

SUMMARY

One embodiment of the present invention is directed to a system for coherently combining a plurality of optical beams. The system includes a resonant cavity, a plurality of gain elements (e.g., N gain elements), a beam-combining element, a sensor, and a phase controller. The gain elements are disposed within the resonant cavity and emit the optical beams, which are coherently combined by the beam-combining element so as to form a coherent output beam. The sensor detects at least a portion of this coherent output beam and provides a feedback signal representative of the coherent output beam. The phase controller, which is operably coupled to the sensor, adjusts a phase of at least one of the optical beams based on the feedback signal so as to increase the coherent output beam's power.

In some examples, the gain elements include a laser array, e.g., with at least seven lasers. These lasers may include solid-state gain media (e.g., semiconductor material), doped optical fibers, organic dye, or gas. The N gain elements may emit optical beams, each of which has a power P, such that the coherent output beam has a power of about 0.5NP to about NP.

In at least one exemplary system, the beam-combining element comprises a diffractive optical element that diffracts at least about 50% of the power in the plurality of optical beams into a single diffraction order. In another example, the beam-combining element comprises a Fourier mask that filters the plurality of optical beams so as to produce the coherent output beam. The beam-combining element may also include a waveguide coupler, which may have one or more phase-modulation regions. These phase-modulation regions vary the optical path lengths of the optical beams in response to signals from the phase controller. And in still another example, the resonant cavity is a Talbot cavity and the beam-combining element comprises a partially reflecting mirror disposed at one end of the Talbot cavity.

In various embodiments described herein, different versions of the coherent beam combining system may use different types of active feedback. For instance, the feedback signal may represent the coherent output beam's power. In these instances, the phase controller dithers the phase(s) of the optical beams based on the feedback signal so as to increase the coherent output beam's power, e.g., according to a hill-climbing algorithm. Alternatively, the feedback signal may represent temporal or spatial interference (e.g., a beat note) between the coherent output beam and a coherent reference beam. In these cases, the phase controller varies the optical beams' phases based on the feedback signal so as to increase the coherent output beam's power, e.g., by locking the coherent output beam to the coherent reference beam.

Similarly, the coherent beam combining system may use any suitable phase modulation technique. For example, the phase controller may modulate the gain elements' current, voltage, or (optical) pump power so as to adjust the phase of the at least one optical beam in the plurality of optical beams. The phase controller may also actuate movement of one or more reflecting elements (e.g., cavity mirrors) with one or more respective actuators (e.g., piezo-electric devices) so as to change the optical beams' optical path length(s). And the phase controller may also be coupled to one or more phase modulators that vary the phases of the optical beams based on the feedback signal from the detector.

In another embodiment, a system for coherently combining optical beams includes an array of lasers, a waveguide coupler, an output coupler, a beam sampler, a detector, and a phase controller. The lasers in the laser array emit the optical beams via respective output surfaces. Each laser in the laser array also has a reflecting surface to reflect the respective optical beam. The waveguide coupler coherently combines the optical beams into a coherent output beam, which illuminates the output coupler. The output coupler reflects a first portion of the coherent output beam back into a resonant cavity that it forms with the lasers' reflecting surfaces. It transmits a second portion of the coherent output beam to the beam sampler, which directs a third portion of the coherent output beam onto the detector. The detector generates a feedback signal proportional to the power in the third portion of the coherent output beam. The phase controller dithers the optical beams' phases according to a hill-climbing algorithm (e.g., stochastic gradient parallel descents), based at least in part on the feedback signal, so as to increase the power of the third portion of the coherent output beam.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. Terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 4A and 4B are plots of the far-field power diffracted from the DOE in FIG. 1 versus horizontal dimension before and after, respectively, the active feedback is turned on.

FIG. 5A illustrates a near-field spectrometer that images each element in the laser array of FIG. 1 onto a line, with an etalon used in a telescope configuration to map frequencies onto circular rings.

FIG. 5B is a plot of the near-field output from the spectrometer shown in FIG. 5A.

FIG. 7A illustrates a power oscillator that coherently combines optical beams using an in-plane, reflective DOE.

FIG. 7B illustrates a power oscillator that coherently combines optical beams using an out-of-plane, reflective DOE.

DETAILED DESCRIPTION

Unlike conventional coherent beam combining (CBC) architectures, inventive CBC architectures according to various embodiments of the present invention use active feedback to control phases of respective outputs of an array of gain elements, such as a laser array, in a resonant cavity. Such active phase control implementations may be achieved, at least in part, using an active hill climbing algorithm, such as stochastic parallel gradient descent (SPGD), to dither the phase so as to increase the intensity of the coherent output beam. Active phase control can also be implemented according to various embodiments of the present invention using heterodyne or homodyne detection of the coherent output beam. The phase of each output may be controlled by modulating each gain element, the optical path lengths of the gain elements' outputs, or both the gain elements and the optical path lengths.

Using both active feedback and a resonant cavity makes it possible to coherently combine a larger number of beams than is possible with a resonant cavity alone. This is because the active phasing configurations disclosed herein are not subject to the same scaling limits imposed on conventional passive phasing CBC systems. In addition, the combining efficiency is high, especially compared to using a resonant cavity alone. For instance, one of the systems described below combines beams from 21 gain elements with an experimentally realized combining efficiency of 81% and a theoretical combining efficiency of up to 90%. Further improvements in the beam combining efficiency may be obtained largely by using a higher efficiency diffractive optical element (DOE) and by minimizing the non-common path aberrations introduced by the bulk optical elements.

A CBC system with active phasing according to various inventive embodiments disclosed herein can be used in any laser application where higher power is desired, especially those where scaling to higher power is limited by thermal effects (e.g., extreme ultraviolet (EUV) generation from plasmas using pulsed lasers). CBC in an oscillator configuration, rather than a master oscillator power amplifier (MOPA) configuration, may also desirable when high efficiency is desired (to conserve battery life for example) since oscillator configurations tend to be more efficient than MOPA configurations. Also, an oscillator tends to be less complicated than a MOPA, so applications where small size or low weight are important would favor implementation in an oscillator rather than in a MOPA. Size and weight may be important for applications involving an airplane or satellite, such as pulsed LIDAR, or where portability is desired, such as in color displays, remote spectroscopy, and airport signaling beacons.

Active Feedback in an Optical Oscillator

Figure 1:
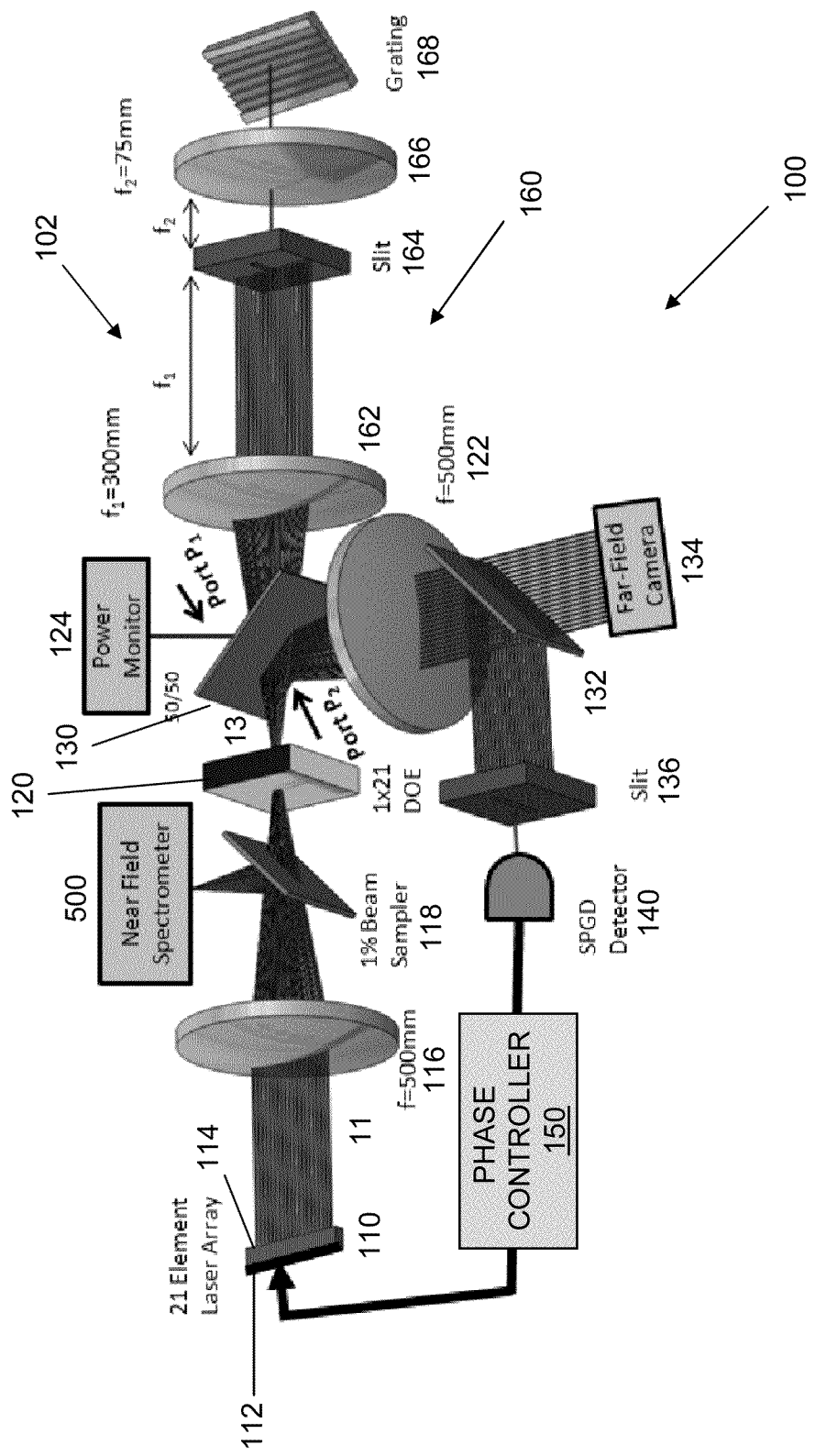
FIG. 1 illustrates a power oscillator with active feedback for coherently combining the outputs of 21 gain elements in a resonant cavity using a diffractive optical element (DOE).

FIG. 1 shows a filled-aperture CBC system 100 that coherently combines beams 11 from laser emitters in a resonant cavity 102 using active phasing, according to one embodiment of the present invention. The CBC system 100 includes an array of gain elements, shown in FIG. 1 as a monolithic, semiconductor laser array 110. This laser array 110 is a one-dimensional array, but those of ordinary skill in the art will readily appreciate that it could be a two-dimensional array. The laser array 110 includes twenty-one microlensed, slab-coupled waveguide amplifiers (SCOWA) with a peak gain at approximately 943 nm. The SCOWAs allow for a large output beam (e.g., with a diameter of about 6 microns) while maintaining operation in a single transverse mode. This is because the SCOWAs in the array 110 include a ridge-guided structure (not shown) that selectively couples the higher-order modes into a slab by design. The fundamental mode does not undergo this coupling and therefore experiences the least loss. The large mode increases the catastrophic optical damage threshold by decreasing the intensity in the guide and at the facet.

The laser array 110 has a back-facet high reflectivity (HR) coating 112 with a reflectivity of 95%, and a front-facet anti-reflection (AR) coating 114. This back-facet high reflectivity coating 112 defines one side of the CBC system's resonant cavity 102. The AR coating 114 transmits optical beams 11 from the lasers to a microlens array (not shown) that collimates the optical beams. The modal field diameter at the microlens is approximately 100 µm, resulting in a 50% fill factor given a 200 µm spacing between the elements in the laser array 110.

Other suitable gain elements that may be employed instead of the laser array 110 in alternative embodiment of the present invention include, but are not limited to, arrays of doped optical fibers, channel waveguides, liquid or solid dye media, and gases (e.g., He—Ne gas mixtures). For example, the array of gain elements may include an array of erbium-doped fibers, each of which includes a doped region bounded on one end by an HR fiber Bragg grating and on the other end by a partially reflecting fiber Bragg grating. Like the HR coating 112 on the laser array 110 shown in FIG. 1, the HR fiber Bragg gratings form one end of a resonant cavity that contains the erbium-doped fibers. Alternatively, the gain elements may include separate regions of a dye stream or one or more chambers that hold a gaseous gain medium.

The CBC system 100 also includes a first lens 116 that focuses the optical beams emitted by the laser array 110 onto a diffractive optical element (DOE) 120, which is also within the resonant cavity 102. In one implementation, the first lens 116 has a focal length of f=500 mm, which is chosen to match the angular separation between the diffracted orders of the DOE 120 to the pitch of the laser array 110 as in $\Delta\theta=(200$ µm)/f. A beam splitter 118 reflects a portion of the focusing optical beams (e.g., about 1%) towards a near-field spectrometer 500, which is also in a focal plane of the first lens 116. The near-field spectrometer measures the spectral output of the laser array 110 as explained in greater detail below.

As understood by those of ordinary skill in the art, the DOE 120 may include a phase plate, grating, holographic element, or any other structure suitable for diffracting incident light. For instance, the DOE 120 may include a binary phase plate whose thickness varies as a function of position so as to diffract incident light in one or more predetermined directions (angles). The DOE 120 also may include a computer-generated hologram formed by printing an amplitude mask on a transparent substrate. Alternatively, the DOE 120 may include a volume hologram that operates in the Bragg regime to increase the diffraction efficiency into a desired diffraction order.

The DOE 120 acts as both a beam combiner and a beam splitter in the CBC system 100 shown in the embodiment of FIG. 1. The DOE 120 diffracts substantially all of the power in the optical beams from the laser array 110 into a single diffraction order-in this case, a zero-order beam 13. The remaining power is diffracted into the higher diffraction orders. The DOE 120 also serves to create twenty-one diffraction orders (e.g., optical beams 11) with an angular separation between orders of 400 grads when illuminated with a single beam (e.g., the reflected zero-order beam 13). These diffraction orders propagate into the lasers in the laser array 110 to provide passive phase control via the cavity resonance. The DOE 120 shown in FIG. 1 is 90% efficient when used as a splitter into 21 beams. The remaining 10% of the power is diffracted into higher DOE orders or scattered.

The CBC system 100 includes a second beam splitter 130 with a first port $P_1$ and a second port $P_2$ at the output of the DOE 120. This second beam splitter 130 acts as an output coupler in the resonant cavity 102. It transmits the orders diffracted by the DOE 120 towards a spatial filter 160, which suppresses the undesired diffraction orders at the output of the DOE 120 to prevent undesired feedback into the laser array 110. The spatial filter 160 includes a 100 µm wide vertical slit 164 in the Fourier plane of a 4f telescope formed by a second lens 162 and a third lens 166. In one implementation, the focal lengths of the lenses ($f_1$=300 mm, $f_2$=75 mm) are chosen for compactness and for a practical spot size at the vertical slit 164. For this focal length $f_1$, the zero-order beam from the DOE 120 has a 60-micron diameter at the vertical slit 164. The third lens 166 yields a spatially filtered, collimated beam with a diameter of approximately 1.25 mm.

The spatially filtered, collimated beam illuminates a diffraction grating 168 operating in a Littrow configuration to form one end of the resonant cavity 102 (recall that the other end of the resonant cavity 102 in the embodiment of FIG. 1 is back-facet high reflectivity coating 112 of the laser array 110). The grating's zeroth order exits the resonant cavity 102 to provide the CBC system's coherently combined output beam 13. The grating's first order feeds back into the resonant cavity 102 with a 76% diffraction efficiency to control the wavelength(s) of the optical beams emitted by the laser array 110 (and of the coherently combined output beam). The CBC system 100 may also include an actuator (not shown) to tilt the grating 168 so as to change the wavelength of the system's output beam.

The light returned from the diffraction grating 168 propagates back through the vertical slit 164 to the beam splitter 130, which transmits a portion (e.g., 50%) of the light back through the DOE 120 to the laser array 110. The beam splitter 130 also reflects another portion (e.g., 50%) of the reflected desired order out through the first port $P_1$ to a power monitor 124, which can be used to determine the CBC system's combining efficiency.

In addition, the beam splitter 130 reflects a portion of the diffracted orders from the DOE 120 through the second port $P_2$ towards another beam splitter 132 via another lens 122. This additional beam splitter 132 transmits the diffracted orders to a far-field camera 134, such as a charge-coupled device (CCD) or complementary metal-oxide-semiconductor (CMOS) array. The far-field camera 134 senses a far-field image of the diffraction pattern from the DOE 120 for use in determining the CBC system's performance.

The additional beam splitter 132 also reflects the diffracted orders towards another (optional) vertical slit 136, which is positioned in front of a detector, shown in FIG. 1 as a stochastic parallel gradient descent (SPGD) detector 140, which may be either a point detector, such as a photodiode, or a detector array, such as a CCD or CMOS array. The vertical slit 136 acts as a spatial filter that transmits the zero-order diffraction from the DOE 120 and blocks or attenuates the other orders diffracted from the DOE 120. The detector 140 senses the zero-order beam and provides an electrical feedback signal, such as a photocurrent, proportional to the power of the detected beam.

The detector 140 transmits this electrical feedback signal to a phase controller 150 as shown in FIG. 1. This phase controller 150 may include one or more input/output interfaces, memory, and a processor, such as a field-programmable gate array (FPGA), application-specific integrated circuit (ASIC), or any other suitable processing device. The phase controller 150 uses the electrical signal to determine an appropriate adjustment to the phase(s) of the optical beams emitted by the laser array 110 using a suitable control technique. Examples of suitable control techniques include, but are not limited to: gradient descent techniques, random descent techniques, stimulated annealing, genetic algorithms, and any other suitable model-free optimization technique.

For instance, in one embodiment, the phase controller 150 may dither the phases according to a hill-climbing algorithm, such as SPGD, so as to increase the power in the coherently combined output beam. SGPD is a "blind" or "model-free" optimization technique in which small, statistically independent perturbations are applied simultaneously (in parallel) to the system control parameters (e.g., the phases of the optical beams). Applying these perturbations may cause the system's performance to change (e.g., the coherent output beam's power may go up or down). Because the perturbations are statistically independent, perturbing the system just one time makes it possible to estimate the gradient descent (e.g., the derivative of the coherent output beam's power with respect the phases of the optical beams) with an average accuracy of $O(\sigma^2)$, where $\sigma^2$ is the variance. For more information on SGPD, see M. A. Vorontsov and V. P. Sivokon, "Stochastic parallel-gradient-descent technique for high-resolution wave-front phase-distortion correction," J. Opt. Soc. Am. A, Vol. 15, No. 10, pp. 2745-2758 (October 1998), which is hereby incorporated herein by reference in its entirety.

Alternatively, or in addition, the detector 140 may sense a heterodyne or homodyne beat between the coherently combined zero-order beam from the DOE 120 and a coherent reference beam, such as a beam from a stable external reference (e.g., a Fabry-Perot cavity or stable laser), one of the optical beams generated by the laser array, or a delayed copy of the zero-order beam. The coherently combined zero-order beam and the coherent reference beam mix at the detector to produce an interference pattern, such as a temporal beat note, which can be used to control the phases of the optical beams so as to increase the power in the coherently combined output beam. For instance, the detector 140 and phase controller 150 may apply self-synchronous locking as disclosed in U.S. Pat. No. 7,058,098 to Shay, which is incorporated herein by reference in its entirety. They may also apply heterodyne phase locking, e.g., as shown in FIG. 4 of S. Augst et al., "Coherent beam combining and phase noise measurements of ytterbium fiber amplifiers," Opt. Lett., vol. 29, pp. 474-476 (2004), which is also incorporated herein by reference in its entirety.

As understood by those of skill in the art, the phases of the optical beams can be modulated using one or more of many suitable phase-modulation techniques. For instance, FIG. 1 shows that the phase controller 150 applies the phase perturbations, which may be about $1/100^{th}$ of a wavelength, to the optical beams by modulating the current applied to the laser array 110. The change in current causes the lasers in the laser array 110 to heat up or cool down, which in turn causes the lasers' refractive indices to change. The change in refractive index causes a change in optical path length, which in turn yields a change in the phase of the optical beam propagating along the optical path. Alternatively, or in addition, the phases can be modulated using an external modulator, such as an electro-optic modulator, a piezo-actuated mirror, an optical fiber or Fiber Bragg grating mounted on a fiber stretcher or heating element, a liquid-crystal spatial light modulator, Q switch, or any other suitable device. For example, the phase controller 150 may modulate the current, voltage, or optical pump power applied to the lasers in the laser array 110 to provide slow feedback and apply external electro-optic modulation to provide fast feedback for controlling the optical beams' phases.

As readily understood by those of ordinary skill in the art, the resonant cavity 102 illustrated in FIG. 1 may be modified without departing from the spirit of the invention. For example, the resonant cavity 102 may be optimized for output power by increasing the number of lasers in the laser array 110, by removing the diagnostic ports, by choosing a different output coupler, and by changing the beam-splitting ratios appropriately.

Performance of Active Feedback in an Optical Oscillator

Figure 2:
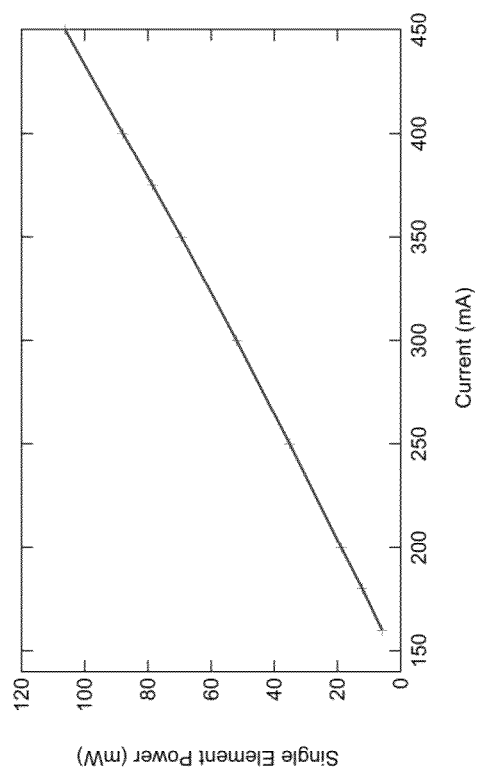
FIG. 2 is a plot of the output power versus current for a single gain element in an external cavity at 960 nm.
Figure 3:
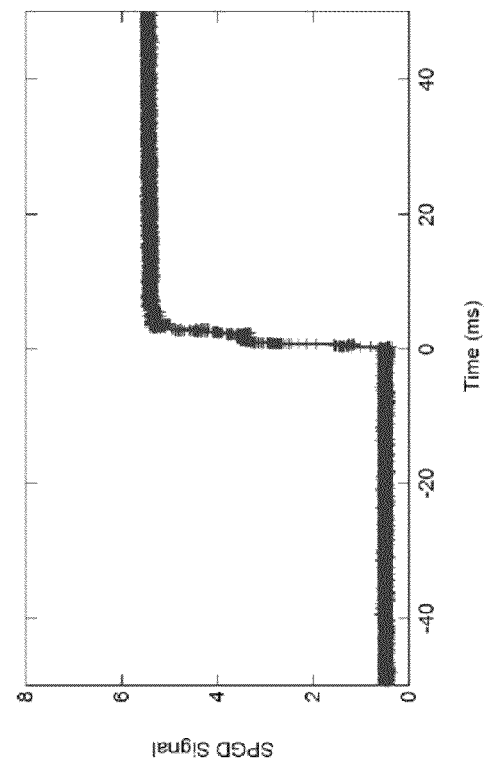
FIG. 3 is a feedback signal from a Stochastic Parallel Gradient Descent (SPGD) detector based on the zero-order power from the DOE in FIG. 1.

FIGS. 2-4 are plots that illustrate the experimental performance of the CBC system 100 shown in FIG. 1 with and without active feedback. As shown below, the combining efficiency is much greater with active feedback than without. With active feedback, the combining efficiency (defined below) is measured to be up to 81% despite a relatively narrow gain bandwidth. (The theoretical limit on combining efficiency in this particular CBC system 100 is up to about 90%.) In addition, the results indicate that single-mode operation is not required.

FIG. 2 is a plot of the total output power versus current from all the ports of the CBC system 100 for a single laser emitter (in this case, the central element in the laser array 110) aligned through the spatial filter 160 with the DOE 120 removed from the cavity 102. The threshold current of the central emitter is about 143 mA with external feedback and is representative of the various emitters within the laser array 110. The intrinsic threshold of an individual laser emitter in the laser array 110 is about 300 mA resulting from the finite reflectivity from the front facet AR coating 114. In the experiments described below, the lasing wavelength was set to about 960 nm and the SCOWAs in the laser array 110 were each biased at 400 mA.

The combining efficiency can be defined as the ratio of the power in the zero-order output of the DOE 120 (plotted in FIG. 2) to the total power. In the resonant cavity 102, the power proportional to the zero-order output is measured through port $P_1$ and the power proportional to the total power is measured through port $P_2$. Measuring the appropriately weighted ratio of the power at the two beam-splitter ports yields a measure of the combining efficiency, $\eta = kP_1/P_2$, where k is an experimentally determined calibration factor. Since the combining efficiency of a single beam is 100% with the DOE 120 removed, k may be measured directly by taking the ratio of the powers on the beam-splitter ports $P_2$ and $P_1$ with a single beam turned on ($k = P_2/P_1$). This technique calibrates for the beam-splitter reflectivity, grating diffraction efficiency, and the transmission through the spatial filter 160.

FIG. 3 is a plot of the feedback signal from the SPGD detector 140 as a function of time. Turning on the active feedback loop (phase controller 150) at t=0 causes the signal to jump as the phase controller 150 dithers the optical beams' phases to maximize the power in the DOE's zero-order output according to the SPGD algorithm. As explained above, the dither phases were applied by adding perturbative currents to the SCOWA gain elements so as to effect phase changes of about 0.01 radians to about 0.2 radians (e.g., 0.06 radians, or $1/100$th of a wave). FIG. 3 shows that the convergence time is typically about 4 ms for a 6 kHz dither.

Figure 4A:
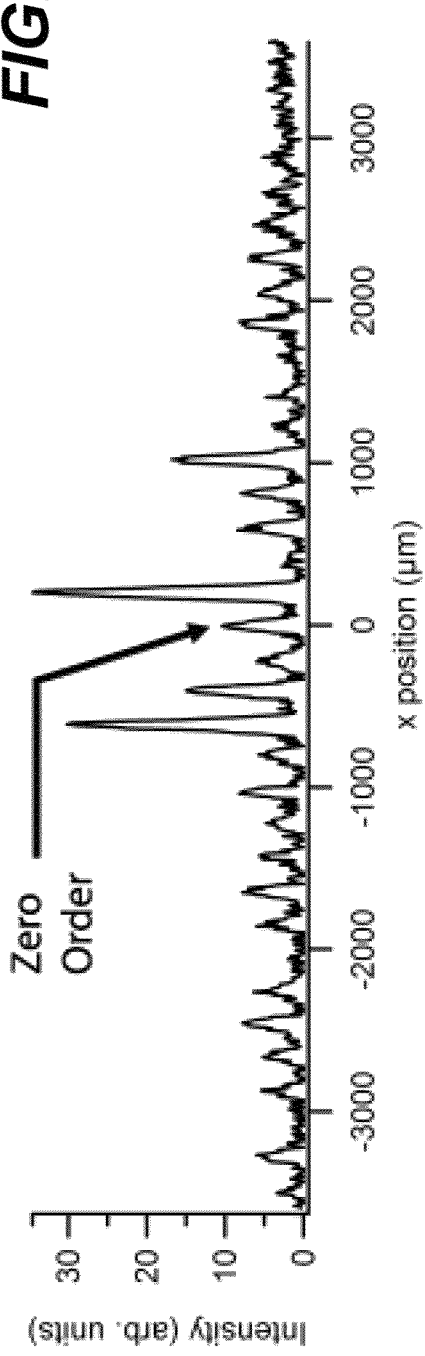
Figure 4B:
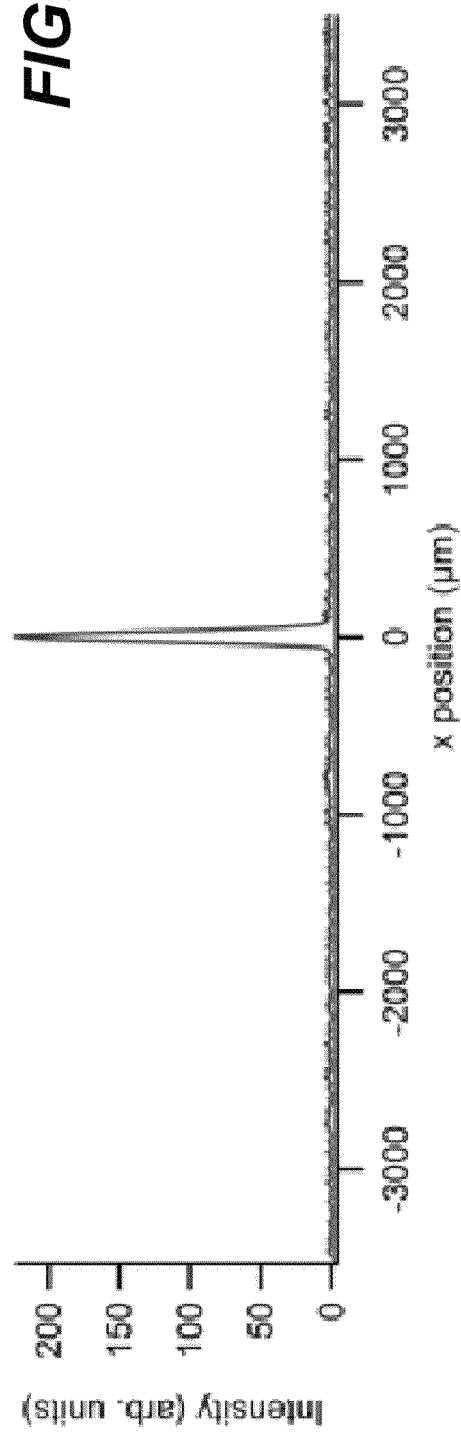

FIGS. 4A and 4B are plots of power versus horizontal position obtained by plotting a single trace from the far-field camera 134 without and with active feedback, respectively. FIG. 4A shows that the combining efficiency in the passive case is estimated to be about 5% by measuring the ratio of the power in the zero order to the total power. This result is qualitatively consistent with incoherent combination where the power splitting among the various orders of a 21-order DOE would ideally result in ($P_{DOE,n} = P_t/21$), where $P_{DOE,n}$ is the power in order n and $P_t$ is the incident power. The power variation among the various orders may be partly attributed to the non-uniform amplitude splitting of the DOE and to the randomness of the phase of individual elements.

Conversely, FIG. 4B shows that, with active feedback, only the zero-order output of the DOE 120 has any appreciable power and is constant with time once SPGD has converged. The power in the remaining diffracted orders are negligible within the 8-bit dynamic range of the camera image. This illustrates that the laser elements add constructively in phase to form the zero-order output. The remaining orders undergo destructive interference.

More specifically, the total output power from the largest output coupling port (port $P_2$ in FIG. 1) is 1.2 W at an average bias current of 400 mA per element of which 81% resides in the zero-order. Put differently, this means that the combining efficiency is about 81% when defined as the appropriately scaled power ratio of the power at the two ports of the 50% beam-splitter. The upper bound on the efficiency for our experiment is limited by the 90% efficiency of the DOE. An estimate for the remaining error sources include the SPGD dither (less than 1%), pointing errors (less than 3%), and microlens aberation (less than 1%). The remaining 4% residual error may be largely attributed to amplitude variations and optical alignment tolerances.

In addition, the beam quality of the coherently combined beam was measured to be $M_x^2 = 1.1$, which is commensurate with that of a single emitter. The beam quality in the non-combining direction was $M_y^2 = 1.6$, which is better than that of a single emitter $M_y^2 = 1.9$. Without being bound to any particular theory, it appears that the improved beam quality is a result of the absence of coherent addition of non-common wavefronts in the coherently combined beam.

Once the phases have been established by SPGD, the active phasing may be turned off without compromising the combining efficiency for extended periods. More specifically, when the drive currents are held fixed to the values used in optimizing the phase, the array elements continue to coherently combine at the same nominal efficiency with less than a 1% variation (tested for at least 60 minutes in the laboratory). This shows that once the path lengths are adjusted, active phasing is not required in order to achieve efficient beam combining for the semiconductor array because of the low phase noise of the semiconductor elements and the optical feedback provided by the diffraction grating. This behavior is similar to the self-sustaining nature of mode-locked lasers.

Near-Field Spectrum of the Coherent Output Beam

The CBC system 100 shown in FIG. 1 also includes a near-field spectrometer 500 to characterize the relative spectral output of the laser array 110. A cylindrical lens (not shown) magnifies the laser array 110 in the vertical direction to produce a set of vertical lines. The cylindrical lens projects these vertical lines onto a rotating screen 502 as shown in FIG. 5A. A first spherical lens 504 images these vertical lines onto a tilted etalon 506, which maps the lines' different spectral components onto different spatial positions. In other words, each position in the line creates an array of angles, and each angle is spatially selected through the etalon 506. A second spherical lens 508 projects these spatially selected angles onto different portions of an output plane 510, where they can be detected using a two-dimensional detector array.

If the gain elements in the laser array 110 are of equal frequency, their outputs will reside on a pattern of circular rings (similar to the fringe pattern arising from interference between a plane wave and a spherical wave). The separation between the rings in the vertical dimension corresponds to the free-spectral range of the etalon (e.g., 20 GHz). Consequently, the output plane's vertical axis corresponds to the frequency of each gain element's output whereas the horizontal axis corresponds to each gain element's position within the laser array 110.

FIG. 5B shows the laser array's output spectrum. The array elements are aligned to form ring patterns indicating that they are operating at the same frequency. Dynamically, the modes (rings) move in unison. Multimode behavior is also sometimes observed but is of no consequence to the coherently combined output. Optical spectrum analyzer (OSA) measurements indicate that the lasing bandwidth may be as large as 0.4 nm (130 GHz). The multimode bandwidth is limited by the spot-size on the grating.

Cavity-Based Coherent Beam Combining without Transform Optics

Figure 6A:
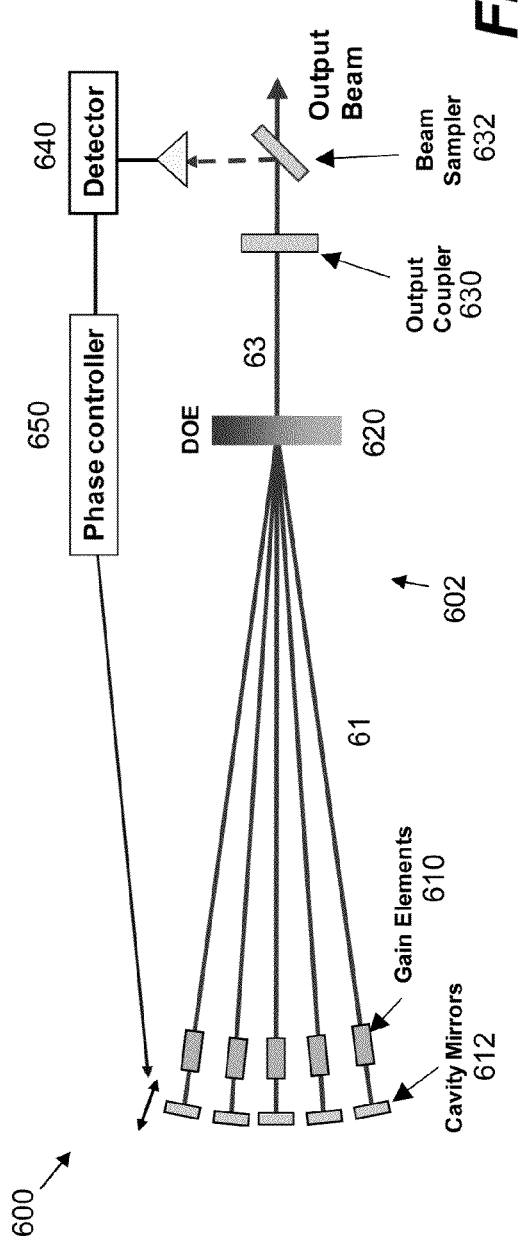
FIG. 6A illustrates a power oscillator without transform optics that coherently combines optical beams using active feedback and a transmissive DOE.
Figure 6B:
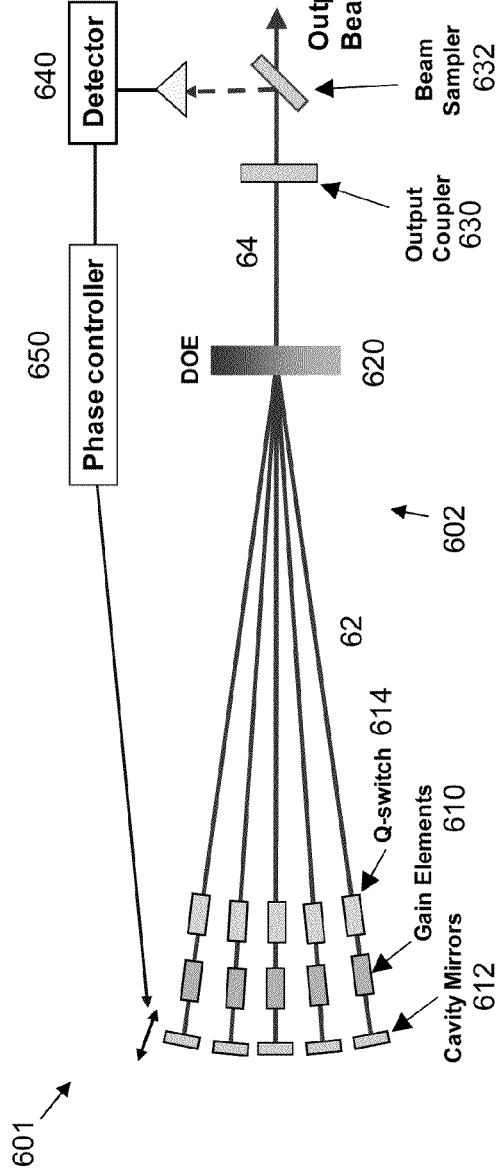
FIG. 6B illustrates the power oscillator of FIG. 6A with active or passive intra-cavity Q-switches in one or more optical beam paths.

FIGS. 6A and 6B illustrate power oscillators that coherently combine optical beams 61 using transmissive DOEs without transform optics. FIG. 6A illustrates a continuous-wave power oscillator 600 that includes an array of gain elements 610 disposed in a resonant cavity 602 formed by cavity mirrors 612 and a partially reflecting output coupler 630. The power oscillator 600 also includes a beam sampler 632, a detector 640, a phase controller 650, and one or more actuators (not shown) coupled to the cavity mirrors 612.

Optical beams 61 emitted by the gain elements 610 resonates within the resonant cavity 602 between the cavity mirrors 612 and the output coupler 630. As the beams 61 resonate, they propagates through a transmissive DOE 620, which coherently combines them into a single coherent output beam 63 propagating towards the output coupler 630 into a coherent output beam as described above with respect to FIG. 1. The output coupler 630 reflects a portion of the coherent output beam back towards the DOE 620, which splits the coherent output beam 63 into optical beams that propagate back to the gain elements 610.

The output coupler 630 transmits another portion of the coherent output beam 63 out of the resonant cavity 602 to the beam sampler 632, which reflects some of the incident light onto the detector 640, which may include a point detector or a detector array. (This beam sampler 632 may also be positioned inside the resonant cavity 602, e.g., between the DOE 620 and the output coupler 630.) The detector 640 integrates the irradiance of the incident over its active area (not shown) for a predetermined integration period and generates a feedback signal, such as a photocurrent, whose amplitude is proportional to the integrated power. The detector 640 transmits this feedback signal to the phase controller 650, which varies the phases of the optical beams 61 so as to maximize the feedback signal's amplitude (and, by extension, the power in the coherently combined output beam).

As shown in FIG. 6A, the phase controller 650 dithers the phases of the optical beams 61 by causing the cavity mirrors 612 to move back and forth so as to increase or decrease the optical path lengths over which the optical beams propagate. For instance, the phase controller 650 may trigger independent piezoelectric actuators that push and pull the cavity mirrors 612 along their respective optical axes. Alternatively, the cavity mirrors 612 may form segments of a larger deformable mirror that is adjusted electrostatically.

FIG. 6B shows a pulsed power oscillator 601 that coherently combines pulsed optical beams 62 using transmissive DOEs without transform optics. Some examples of application for pulsed configurations include military applications, pulsed light detection and ranging (LIDAR), and extreme ultraviolet (EUV) generation from plasmas (e.g., tin or xenon) for lithography. Like the continuous-wave power oscillator 600 shown in FIG. 6A, the pulsed power oscillator 601 includes a set of gain elements 610 disposed in a resonant cavity 602 formed by one or more cavity mirrors 612 on end and a partially reflecting output coupler 630 on the other end.

The resonant cavity 602 also contains one or more Q switches 614, each of which is in the path of a respective optical beam 62 from the gain element array 610. As understood by those of ordinary skill in the art, a Q switch 614 is an active or passive device whose attenuation can be modulated so as to dampen or allow light to resonate in the resonant cavity 602. Modulating the Q switch's attenuation in a periodic fashion causes the emitted light (the coherent output beam 64) to pulse on and off.

The number and positioning of the Q switches 614 depends on the application. For high-power applications, using one Q switch 614 per optical beam reduces the chances of damaging a Q switch 614 with a high-power beam. For low-power applications, it may be possible to generate a pulsed output with a single Q switch 614 in the path of the coherently combined output beam 64. It may also be possible to generate a pulsed output with a single Q switch 614 in the path of only one (uncombined) optical beam.

Hybrid, Cavity-Based Coherent and Spectral Beam Combining

Figures 6C, 6D:
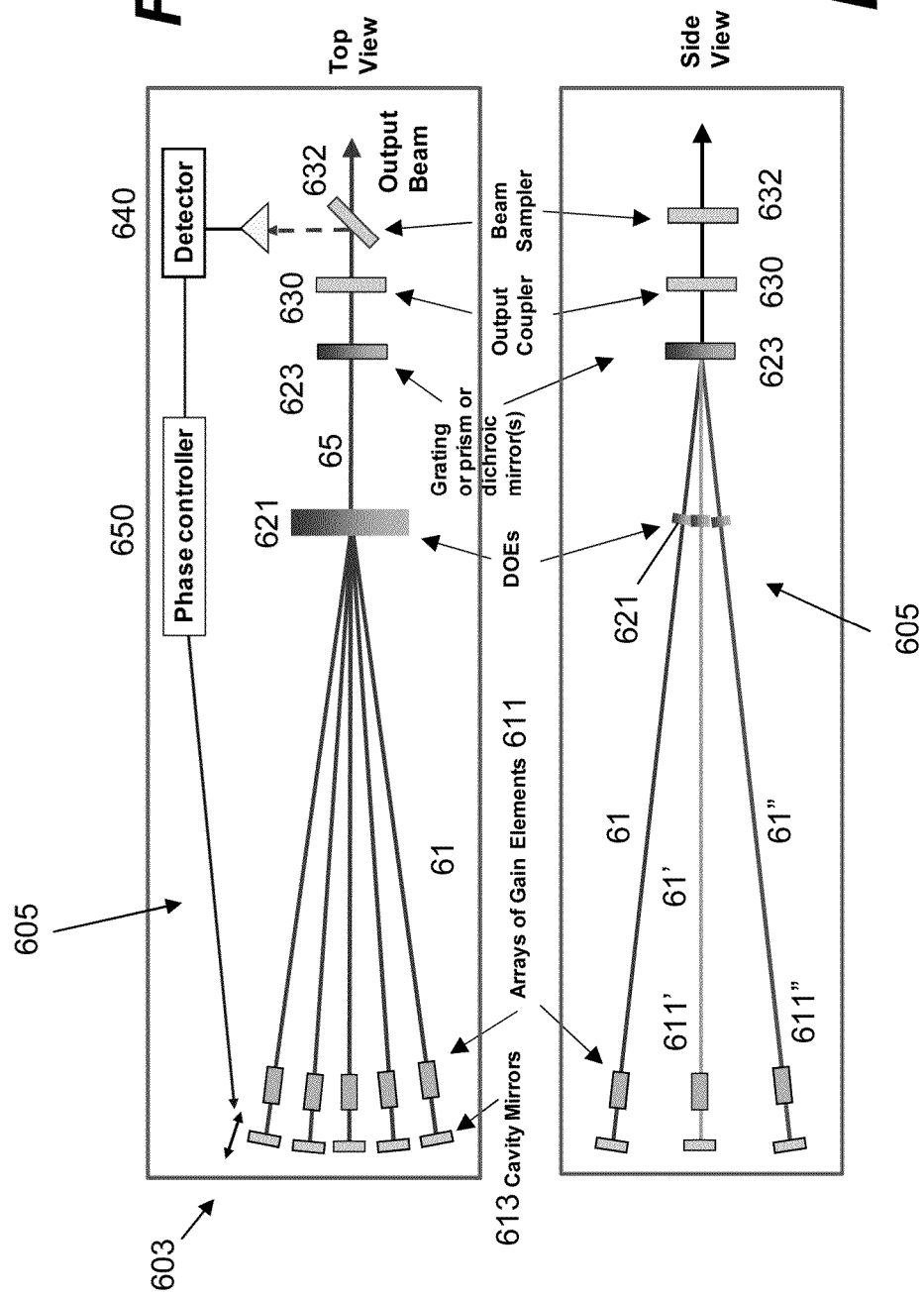
FIGS. 6C and 6D are plan and side views, respectively, of an intra-cavity hybrid power oscillator that coherently combines optical beams at different wavelengths from a two-dimensional array of gain elements using one or more gratings, prisms, and/or dichroic mirrors.

FIGS. 6C and 6D illustrate hybrid coherent and spectral beam combining in a power oscillator 603 with active phase control. Some example applications for this hybrid configuration include color (e.g., red-green-blue) displays, remote spectroscopy, airport signaling beacons, and coherent wavelength-division-multiplexed optical communications. For instance, the power oscillator 603 shown here may be used to probe an unknown chemical compound at two or more wavelengths simultaneously or in sequence from a long distance.

From the top (FIG. 6C), the power oscillator 603 looks similar to the power oscillator 600 shown in FIG. 6A: it includes gain elements 611 disposed in a resonant cavity 605 with cavity mirrors 613 on one end and a partially reflecting output coupler 630 on the other end. A DOE 621 in the cavity coherently combines optical beams 61 emitted by the gain elements 611, and a detector 640 senses the power in part of the resulting coherently combined beam. A phase controller 650 coupled to the detector 640 actuates the cavity mirrors 613 based on a feedback signal from the detector 640 so as to optimize the beam combining operation (e.g., the phase controller 650 maximizes the power in the coherent output beam according to a hill-climbing algorithm, such as SGPD).

The side view in FIG. 6D reveals several differences between the hybrid power oscillator 603 and the power oscillator 600 shown in FIG. 6A. First, the hybrid power oscillator 603 includes three sets of gain elements 611, 611', and 611". These sets of gain elements are arranged in a two-dimensional array and emit beams 61, 61', and 61" at different wavelengths. For instance, the first set of gain elements 611 may emit beams 61 at a first wavelength, the second set of gain elements 611' may emit beams 61' at a second wavelength, and the third set of gain elements 611" may emit beams 61" at a third wavelength. These gain elements may be tunable, and their output wavelength ranges may border each other, overlap, coincide, or be completely separate.

The optical beams 61, 61', and 61" from the different sets of gain elements 611, 611', and 611" intersect (or come close to intersecting) at a point on or with the DOE 621. As understood by those of ordinary skill in the art, this DOE 621 could include a single diffraction pattern for all colors (e.g., if the wavelengths are closely spaced), or an array of (possibly overlapping) diffraction patterns, where each diffraction pattern is optimized for an individual color (e.g., if the colors are widely spaced). A single diffraction grating 623 (shown as transmissive in FIGS. 6C and 6D, but could alternatively be reflective) diffracts the incident beams into a single, overlapping diffraction order 65 that propagates towards the output coupler 630. This diffraction order 65 represents two or more (e.g., three) coherently combined, co-propagating beams, each of which is at a different wavelength. The grating 623 also splits the coherently combined beams reflected from the output coupler 630 for feedback into the corresponding gain elements 611, 611', and 611".

FIG. 6D shows that the DOE 621 includes an array of diffraction patterns to combine each of the three sets of beams. Those of ordinary skill in the art will readily appreciate that the DOE could include a single (suitably designed) diffraction pattern to combine all three sets of beams. Alternatively, any of the configurations shown in FIGS. 1, 6B, 7, and 8 could be used to combine the beams. Those of ordinary skill in the art will also appreciate that the spectrally distinct beams can be combined using appropriate combinations of different elements, including but not limited to prisms, diffraction gratings, and dichroic mirrors.

Cavity-Based, Active Coherent Beam Combining with Reflective DOEs

FIGS. 7A and 7B illustrate power oscillators that coherently combine optical beams using, respectively, in-plane and out-of plane reflective DOEs. FIG. 7A illustrates a continuous-wave power oscillator 700 with an array of gain elements 710 inside a resonant cavity 702 formed by cavity mirrors 712 and a partially reflecting output coupler 730. As in the power oscillators shown in FIGS. 6A-6D, radiation (optical beams 71) emitted by the gain elements 710 resonates within the resonant cavity 702. Unlike other CBC configurations, however, the in-plane configuration of FIG. 7A employs N−1 gain elements for an N-beam reflective DOE 720. As the light resonates, it illuminates the reflective DOE 720, which coherently combines the optical beams propagating away from the gain elements 710 into a coherent output beam 73. Rather than transmitting this coherently combined beam, the DOE 720 reflects it towards the output coupler 730 in the plane of the optical beams.

The output coupler 730 transmits another portion of the coherent output beam 73 out of the resonant cavity 702 to the beam sampler 732, which reflects some of the incident light onto the detector 740. The detector 740 provides a feedback signal indicative of the coherent output beam's power (or possibly power versus time) to a phase controller 750, which varies the phases of the optical beams so as to maximize the feedback signal's amplitude (and, by extension, the power in the coherently combined output beam). For instance, the phase controller 750 may adjust the phases of the optical beams by modulating the current applied to the gain elements 710 or by causing the cavity mirrors 712 to move back and forth as shown in FIG. 7A and described above.

FIG. 7B shows an out-of-plane, reflective power oscillator 701 similar to the in-plane, reflective power oscillator shown in FIG. 7A. The elements shown in FIG. 7B function in the same way(s) as described with respect to FIG. 7A, with one exception: the reflective DOE 721 produces a coherently combined output beam 75 that propagates at an angle with respect to the plane of the optical beams emitted by the gain elements 710. This out-of-plane propagation can be achieved by modifying or tilting the DOE 721. The output coupler 730, beam sampler 732, and detector 740 are aligned to the out-of-plane, coherent output beam 75.

Both the in-plane power oscillator 700 and out-of-plane power oscillator 701 may be modified to produce pulsed output beams, e.g., by placing one or more Q switches in the beam paths inside the resonant cavity 702.

Cavity-Based Coherent Beam Combining with Filtering in the Fourier Plane

Figure 8A:
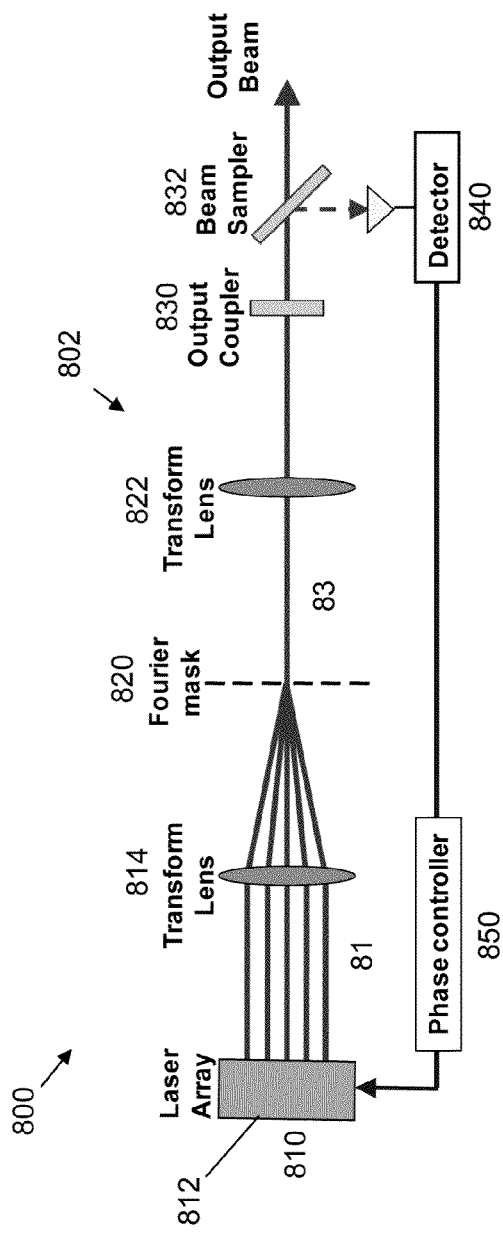
FIG. 8A illustrates a power oscillator with Fourier plane filtering and active feedback.

FIG. 8A illustrates a tiled CBC system, or power oscillator 800, with Fourier plane filtering and active feedback. The power oscillator 800 includes an array of gain elements, shown here as a laser array 810, that generates a set of optical beams 81. These beams 81 may be collimated and propagated parallel to each other as shown in FIG. 8A. A first transform lens 843 projects a spatial Fourier transform of the optical beams onto a Fourier mask 820 in the first transform lens's back focal plane. The Fourier mask 820 includes a substrate whose transmittance varies as a function of spatial dimension. This substrate may include an opaque material, such as a silicon wafer, with slots, slits, or holes cut into it or a transparent substrate with opaque or lossy material deposited onto it, such as a fused silica window with titanium or chromium lines deposited onto it. The sizes of transparent areas on the mask are about on the order of $f\lambda/D$, where f is the focal length of the first transform lens 814, D is the width of the laser array 810, and $\lambda$ is the lasing wavelength.

The Fourier mask 820 spatially filters the incident optical beams 81 so as to produce a coherently combined output beam 83 with most, if not substantially all of the power in the optical beams 81. A second transform lens 822 collimates the output beam 83, which propagates to a partially reflecting output coupler 830 that defines one end of a resonant cavity 802. (One or more reflecting surfaces 812 on the laser array 810 define the other end of the resonant cavity 802.) The output coupler 830 reflects a first portion (e.g., 5-99%) of the coherent output beam back into the resonant cavity 802 and transmits a second portion (e.g., 1-95%) of the coherent output beam 83 out of the resonant cavity 602.

A beam sampler 832 directs a third portion of the coherent output beam 83 to a detector 840, such as a photodiode or detector array. The detector 840 senses the intensity of the coherent output beam and generates a feedback signal representative of the sensed intensity. It transmits this feedback signal to a phase controller 850, which adjusts the phases of the optical beams 81 according to SGPD or any other suitable optimization technique by changing the currents applied to the gain elements in the laser array 810.

Coherent Beam Combining with Active Feedback in a Talbot Cavity

Figure 8B:
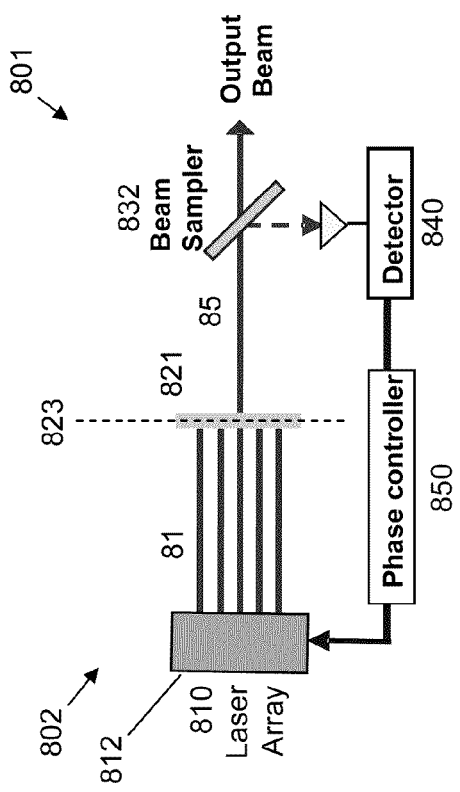
FIG. 8B illustrates a power oscillator with a Talbot cavity and active feedback.

FIG. 8B illustrates a tiled CBC system, or power oscillator 801, with Talbot plane filtering and active feedback. As above, the power oscillator 801 includes an array of gain elements, shown here as a laser array 810, that generates a set of optical beams 81. These optical beams 81 mimic an array of point sources, or a plane wave that illuminates a diffraction grating; as a result, they interfere to form self-images at integer multiples of the Talbot distance, $z_T = 2a^2/\lambda$, where a is the pitch of the laser array 810 and $\lambda$ is the wavelength of the optical beams 81. Scaled and shifted images appear at fractions of the Talbot distance, e.g., $z_T/2$, $z_T/4$, etc. This effect is known as the Talbot effect, and the self-images are known as Talbot images.

The power oscillator 801 in FIG. 8B is designed to exploit the Talbot effect. Like the power oscillator 800 in FIG. 8A, it has a resonant cavity 803. In this case, however, the resonant cavity 803 is a Talbot cavity: its length is equal to the half the Talbot distance (or another suitable multiple of the Talbot distance) associated with the laser array 810. More specifically, it includes a partially reflecting output coupler 821 located in a plane 823 that is an optical distance of $z_T/2$ from the laser array 810. Consequently, the output coupler 821 projects a Talbot image of the laser array 810 back onto the laser array 810 itself. This Talbot image provides passive feedback for phase-locking the lasers together.

In addition to defining part of the Talbot cavity 803, the output coupler 821 also acts as a beam-combining element because it transmits a coherent output beam 85 (the phase-locked outputs of the laser array 810). The beam sampler 832 taps a portion of the coherent output beam 85 onto the detector 840, which generates a feedback signal proportional to the power in the detected portion of the coherent output beam 85. The detector 840 transmits this feedback signal to the phase controller 850, which adjusts the phases of the optical beams 81 according to SGPD or any other suitable optimization technique by changing the currents applied to the gain elements in the laser array 810.

Cavity-Based Coherent Beam Combining with Wave Guide Coupling

Figure 9A:
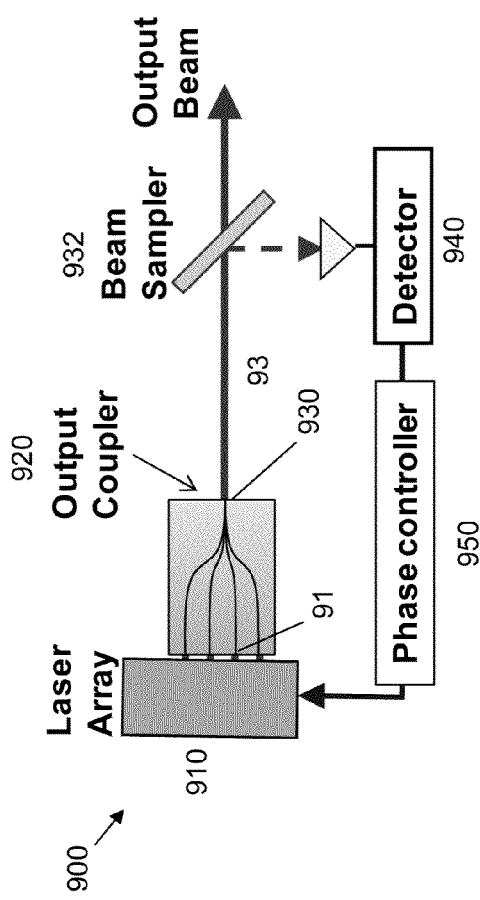
FIGS. 9A and 9B illustrate power oscillators with coupled waveguides and active feedback to the laser array and phase modulation regions in the coupled waveguides, respectively.
Figure 9B:
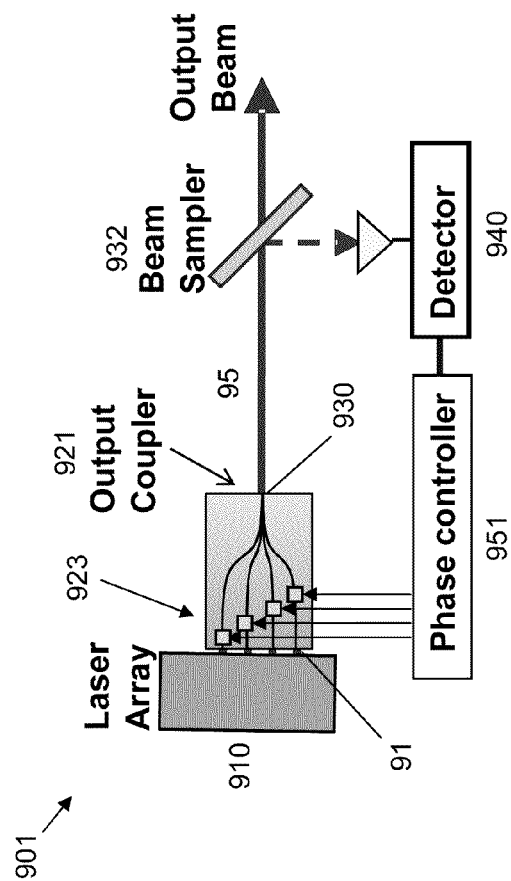

FIGS. 9A and 9B illustrate power oscillators with coupled waveguides and active feedback to the laser array and phase modulation regions in the coupled waveguides, respectively. FIG. 9A shows a power oscillator 900 with a laser array 910 whose back facet is coated in an HR coating 912. The laser array 910 emits optical beams 91 into a waveguide coupler 920, which combines the optical beams 91 into a coherent output beam 93. These beams 91 may be collimated (e.g., with a microlens array as described with respect to FIG. 1), propagate through free space, and be focused (e.g., with another microlens array) into the waveguide coupler 920. Alternatively, the laser array 910 and the waveguide coupler 920 may be mated together or even formed on the same substrate (e.g., integrated onto a single semiconductor slab), eliminating the need for bulk optics or free-space propagation.

As understood by those of skill in art, the waveguide coupler 920 may combine the optical beams 91 into the coherent output beam 93 using evanescent coupling, interference, or any other suitable coupling mechanism. For instance, the waveguide coupler 920 may include a piece of lithium niobate or semiconductor with adjacent waveguides formed by ion implantation or any other suitable technique. Similarly, the waveguide coupler 920 may include a fiber-based coupler, such as a 1×N fused fiber coupler that operates by evanescent coupling or interference coupling.

The waveguide coupler 920 includes an output port 930 that defines one end of a resonant cavity 902 (the HR coatings 912 on the laser array 910 form the resonant cavity's other end(s)). This output port 930 may be formed by a cleaved facet (e.g., for a semiconductor waveguide coupler 920) or fiber tip (e.g., for a fiber-based waveguide coupler 920) that reflects a portion (e.g., 50-99%) of the coherent output beam back into the resonant cavity 902 and transmits the rest. For fibers and semiconductors, it is common to use the Fresnel reflection, which may be about 3-25%, from an uncoated facet as the output coupler because the gain is so high. The output port 930 may also be coated in a partially transmitting coating that reflects some light and transmits the rest of the light.

A beam sampler 932 reflects a portion of the transmitted coherent output beam 93 to a detector 940, which generates a feedback signal proportional to the power of the detected light. The detector 940 transmits this signal to a phase controller 950, which dithers the phases of the optical beams 91 by changing the currents applied to the lasers in the laser array 910. The phase controller 950 may dither the currents according to the SGPD algorithm discussed above so as to maximize the power in the coherent output beam 93.

FIG. 9B illustrates a power oscillator 901 with a phase-modulating waveguide coupler 921. Like the waveguide coupler 920 shown in FIG. 9A, the phase-modulating waveguide coupler 921 coherently combines the outputs 91 of the laser array 910 to form a coherent output beam 95, e.g., using evanescent coupling among adjacent waveguides. The phase-modulating waveguide coupler's partially reflecting output port 930 reflects some of the coherent output beam 95 back towards the laser array 910 and transmits the rest to the beam sampler 932. As described above, the beam sampler 932 directs some of the incident light to the detector 940, which emits a feedback signal to a phase controller 951 for adjusting the phases of the optical beams 91 so as to maximize the power in the coherent output beam 95.

The phase controller 951 adjusts the optical beams' phases by changing the optical path lengths of phase-modulation regions 923 in the waveguide coupler 921. In some examples, these phase-modulation regions 923 are portions of lithium niobate or semiconductor material subject to electromagnetic fields (e.g., applied voltages or thermal radiation). Changing the amplitude or polarity of a voltage applied to a particular phase-modulation region 923 causes the region's refractive index to change, which in turn changes the optical path length experienced by the propagating optical beam. Similarly, heating a particular phase-modulation region 923 causes the region's refractive index to change as well.

In a fiber-based waveguide coupler 921, the phase-modulation regions 923 may include fiber stretchers or fiber heaters. For instance, a particular phase-modulation region 923 may include a piece of optical fiber wound around or otherwise secured to length of a piezo-electric material. Applying a voltage to the piezo-electric material causes the piezo-electric material (and the optical fiber) to stretch, increasing the length of the optical path through which the corresponding optical beam propagates. Likewise, heating a length of optical fiber causes the optical fiber's refractive index (and optical path length) to change.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the phase controller (e.g., phase controller 150 in FIG. 1) may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A system for coherently combining a plurality of optical beams, the system comprising:
   a resonant cavity;
   a plurality of gain elements, disposed within the resonant cavity, to emit the plurality of optical beams, the plurality of optical beam comprising N>10 optical beams, each optical beam in the plurality of optical beams having a power P and a spectral linewidth of less than about 0.4 nm;
   a beam-combining element, in optical communication with the plurality of gain elements, to coherently combine the plurality of optical beams into a coherent output beam, the coherent output beam having a power of about 0.8NP to about NP;
   a sensor, in optical communication with the beam combining-element, to sense at least a portion of the coherent output beam and to provide a feedback signal representative of the at least a portion of the coherent output beam; and
   a phase controller, operably coupled to the sensor, to adjust a phase of at least one optical beam in the plurality of optical beams based at least in part on the feedback signal.

2. The system of claim 1, wherein the plurality of gain elements comprises at least one of a solid-state gain medium, a doped optical fiber, an organic dye, and a gas.

3. The system of claim 1, wherein the plurality of gain elements comprises:
   a first plurality of gain elements to emit a first plurality of optical beams at a first wavelength; and
   a second plurality of gain elements to emit a second plurality of optical beams at a second wavelength, wherein the beam-combining element is configured to coherently combine the first plurality of optical beams into a first coherent output beam and to coherently combine the second plurality of optical beams into a second coherent output beam, and further comprising:

another beam-combining element, in optical communication with the beam-combining element, to spectrally combine the first coherent output beam and the second coherent output beam.

4. The system of claim 1, wherein the beam-combining element comprises:

a diffractive optical element to diffract at least about 50% of the power in the plurality of optical beams into a single diffraction order of the diffractive optical element.

5. The system of claim 1, wherein the beam-combining element comprises:

a mask, disposed in or near a Fourier plane of the plurality of gain elements, to spatially filter the plurality of optical beams so as to produce the coherent output beam.

6. The system of claim 1, wherein the beam-combining element comprises a waveguide coupler.

7. The system of claim 6, wherein the waveguide coupler further comprises:

at least one modulation region, operably coupled to the phase controller, to vary an optical path length of the at least one optical beam in the plurality of optical beams based at least in part on the feedback signal.

8. The system of claim 1, wherein the resonant cavity is a Talbot cavity and the beam-combining element comprises a partially reflecting mirror disposed at one end of the Talbot cavity.

9. The system of claim 1, wherein:

the feedback signal represents a power of the coherent output beam; and the phase controller is configured to dither the phase of at least one optical beam in the plurality of optical beams, based at least in part on the feedback signal, so as to increase the power of the coherent output beam.

10. The system of claim 9, wherein the phase controller is configured to dither the phase of the at least one optical beam according to a hill-climbing algorithm.

11. The system of claim 1, wherein:

the feedback signal represents interference of the coherent output beam with a coherent reference beam; and the phase controller is configured to adjust the phase of at least one optical beam in the plurality of optical beams, based at least in part on the feedback signal, so as to increase a power of the coherent output beam.

12. The system of claim 11, wherein the phase controller is configured to dither the phase of the at least one optical beam so as to lock the coherent output beam to the coherent reference beam.

13. The system of claim 1, wherein the phase controller is configured to adjust at least one of a current, a voltage, and a pump power applied to at least one gain element in the plurality of gain elements, based at least in part on the feedback signal, so as to adjust the phase of the at least one optical beam in the plurality of optical beams.

14. The system of claim 1, further comprising:

a reflecting element, in optical communication with at least one gain element in the plurality of gain elements, to reflect at least a portion of an output of the at least one gain element into the resonant cavity; and at least one actuator, coupled to the reflecting element, to vary an optical path length between the reflecting element and the at least one gain element in response to a signal from the phase controller so as to adjust the phase of the at least one optical beam in the plurality of optical beams.

15. The system of claim 1, further comprising:

a phase modulator, in optical communication with at least one gain element in the plurality of gain elements, to adjust the phase of the at least one optical beam in the plurality of optical beams in response to a signal from the phase controller.

16. The system of claim 1, further comprising:

at least one Q switch, in optical communication with at least one gain element in the plurality of gain elements, to cause the at least one optical beam in the plurality of optical beams to pulse on and off.

17. A method of coherently combining a plurality of optical beams, the method comprising:

(A) emitting the plurality of optical beams from a plurality of gain elements disposed within a resonant cavity, the plurality of optical beams comprising $N \leq 10$ optical beams, each optical beam in the plurality of optical beams having a power P and a spectral linewidth of less than about 0.4 nm;

(B) coherently combining the plurality of optical beams within the resonant cavity so as to form a coherent output beam, the coherent output beam having a power of about 0.8NP to about NP;

(C) sensing at least a portion of the coherent output beam so as to provide a feedback signal representative of the at least a portion of the coherent output beam; and (D) adjusting a phase of at least one optical beam in the plurality of optical beams based at least in part on the feedback signal.

18. The method of claim 17, wherein (A) comprises:

(A1) emitting a first plurality of optical beams at a first wavelength; and (A2) emitting a second plurality of optical beams at a second wavelength; and wherein (B) comprises:

(B1) coherently combining the first plurality of optical beams so as to form a first coherent output beam;

(B2) coherently combining the second plurality of optical beams so as to form a second coherent output beam; and (B3) spectrally combining the first coherent output beam and the second coherent output beam.

19. The method of claim 17, wherein (B) comprises:

diffracting substantially all of the power in the plurality of optical beams into a single diffraction order of a diffractive optical element so as to produce the coherent output beam.

20. The method of claim 17, wherein (B) comprises:

filtering the plurality of optical beams so as to produce the coherent output beam.

21. The method of claim 17, wherein (B) comprises:

coupling the plurality of output beams into a waveguide coupler.

22. The method of claim 17, wherein (B) comprises:

reflecting at least a portion of the power in the plurality of optical beams with a reflecting surface of the plurality of gain elements so as to produce a Talbot image of the plurality of gain elements at an output plane of the plurality of gain elements.

23. The method of claim 17, wherein (C) comprises:

detecting a power level of the at least the portion of the coherent output beam.

24. The method of claim 17, wherein (C) comprises:

detecting interference of the coherent output beam with a coherent reference beam.

25. The method of claim 24, wherein (D) comprises:
dithering the phase of the at least one optical beam so as to lock to the coherent output beam to the coherent reference beam.

26. The method of claim 17, wherein (D) comprises:
dithering the phase of the at least one optical beam in the plurality of optical beams, based at least in part on the feedback signal, so as to increase the power of the coherent output beam.

27. The method of claim 26, wherein (D) further comprises:
dithering the phase of the at least one optical beam according to a hill-climbing algorithm.

28. The method of claim 17, wherein (D) comprises:
adjusting at least one of a current, a voltage, and a pump power applied to at least one gain element in the plurality of gain elements, based at least in part on the feedback signal, so as to adjust the phase of the at least one optical beam in the plurality of optical beams.

29. The method of claim 17, wherein (D) comprises:
varying an optical path length transited by the at least one optical beam in the resonant cavity in response to a signal from the phase controller so as to adjust the phase of the at least one optical beam.

30. The method of claim 17, further comprising:
(E) pulsing the at least one optical beam on and off.

31. A system for coherently combining a plurality of optical beams, the system comprising:
an array of laser gain elements to emit the plurality of optical beams, the plurality of optical beams comprising N>10 optical beams, each optical beam in the plurality of optical beams having a power P and a spectral linewidth of less than about 0.4 nm, wherein:
each laser gain elements in the array of laser gain elements includes:
a corresponding reflecting surface of the plurality of reflecting surfaces to reflect a corresponding optical beam of the plurality of optical beams and
an output surface to emit the corresponding optical beam;
a waveguide coupler, in optical communication with the array of laser gain elements, to coherently combine the plurality of optical beams into a coherent output beam, the coherent output beam having a power of about 0.8NP to about NP;
an output coupler, in optical communication with the waveguide coupler and the array of laser gain elements so as to form at least one resonant cavity with the plurality of reflecting surfaces of the gain elements, to reflect a first portion of the coherent output beam back through the waveguide coupler to the array of laser gain elements and to emit a second portion of the coherent output beam;
a beam sampler, in optical communication with at least one of the waveguide coupler and the output coupler, to tap a third portion of the coherent output beam from the coherent output beam;
a detector, in optical communication with the beam sampler, to provide a feedback signal representative of a power of the third portion of the coherent output beam; and
a phase controller, operably coupled to the sensor and to the array of laser gain elements, to dither phases of respective optical beams of the plurality of optical beams according to a stochastic gradient parallel descents algorithm, based at least in part on the feedback signal, so as to increase a power of the third portion of the coherent output beam.

32. The system of claim 1, wherein the resonant cavity has a free spectral range less than a gain bandwidth of the plurality of gain elements.

33. The method of claim 17, wherein (D) comprises:
(D1) adjusting a drive current applied to a gain element in the plurality of gain elements to a level based at least in part on the feedback signal; and
(D2) maintaining the drive current at the level applied to the gain element in (D1).

* * * * *